SUPERCONDUCTING SWITCHING DEVICE UTILIZING PLURAL CONTROL SUPERCONDUCTORS

Filed Nov. 1, 1962

Inventors:
Robert E. Fruin,
Vernon L. Newhouse,
by John P. Dellitt
Their Attorney.

United States Patent Office 3,182,209

Patented May 4, 1965

3,182,209

SUPERCONDUCTING SWITCHING DEVICE UTILIZING PLURAL CONTROL SUPERCONDUCTORS

Robert E. Fruin, Schenectady, and Vernon L. Newhouse, Scotia, N.Y., assignors to General Electric Company, a corporation of New York Filed Nov. 1, 1962, Ser. No. 234,813

8 Claims. (Cl. 307—88.5)

Figure 1:
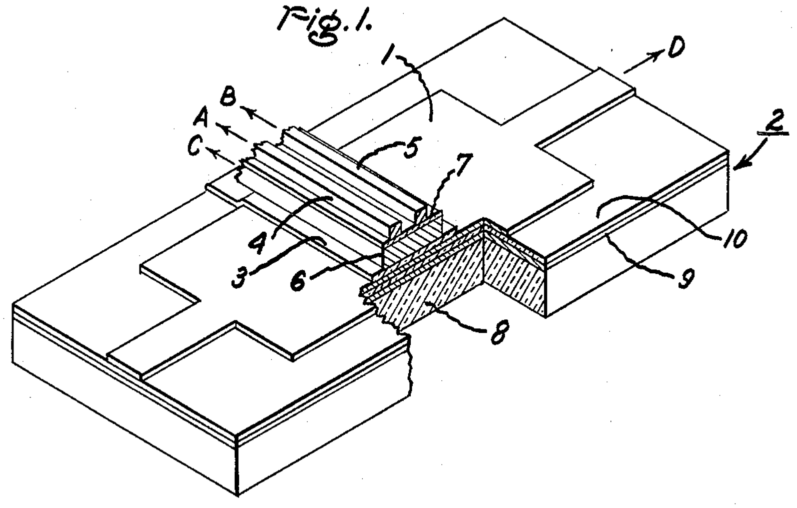

This invention relates to a superconducting switching device and particularly to such a device responsive to combination of separate control currents.

The conventional superconducting switching device or cryotron comprises a gate superconductor and a closely related grid control superconductor which is effective to change the resistance of the gate superconductor from substantially zero resistance to a finite or normal value. The gate superconductor is formed of a material exhibiting a first low "critical" magnetic field, the field at which its resistance is caused to return, while the grid superconductor exhibits a second and higher critical magnetic field. Current passing through the control conductor generates a magnetic field greater than the critical field of the gate superconductor and thereby renders the gate superconductor resistive, forcing gate current into an alternative path. Since the control superconductor has a higher critical field, it may remain superconducting under current flow conditions. This cryotron superconducting switching device is essentially a gating device of the off-on variety and is primarily responsive to a single control current.

It has been proposed that a superconducting switching device be made responsive to a number of separate control currents which may be partly opposing or cancelling to provide directional "biased" operation and the like. Such interaction is, however, not achieved by providing a single cryotron gate with a number of unrelated control grids because the various control grids tend to have independent effects upon the gate, i.e. grid currents each tend to render the gate resistive, regardless of the direction of grid control current flow. In one suggested plural-input, thin film type of superconducting switching device, a plurality of control superconductors are disposed transversely across the gate superconductor with one thin film control superconductor overlaying another control superconductor in substantial registry therewith. In this arrangement each of the control superconductors desirably has the same effect upon the gate superconductor. Then current in one control superconductor should effectively cancel an equal and opposite "bias" current in the second control superconductor. However it has been found this construction will not provide effective cancellation unless the two control superconductors are almost perfectly registered with one another. Such perfect registry is difficult to attain in practical devices where a certain amount of "shadowing" takes place in manufacture.

It is accordingly an object of the present invention to provide an improved superconducting switching device responsive to plural control currents.

It is another object of the present invention to provide an improved superconducting switching device achieving close coupling between control superconductors wherein almost any number of control conductors produce equal and associated effects upon the gate conductor.

It is another object of the present invention to provide an improved superconducting switching device responsive to the algebraic sum of control input currents and not to the placement or formation of the control superconductors.

It is another object of the present invention to provide an improved superconducting switching device, responsive to plural input currents, which is simple in construction but which achieves exact cancellation between oppositely directed control currents.

It is a further object of the present invention to provide an improved superconducting switching device responsive to the direction of control grid currents.

Briefly in accordance with an embodiment of the present invention, a gate superconductor has disposed thereacross a plurality of control superconductors, with one wider than the rest, interposed between the rest and the gate superconductor. Current applied to the remaining control superconductors generates a magnetic flux which must pass completely around the widened interposed control superconductor if the magnetic flux is to reach and affect the gate superconductor. The wider control superconductor acts to concentrate the flux from the narrower control superconductors at a given area or areas of the gate superconductor whereby the gate superconductor sees only the net flux or net effect of the control superconductors as if they were not multiple but unitary. Thus equal and opposite currents applied to control superconductors are capable of nearly exact cancellation inasmuch as the net flux passing the edges of the wider interposed control superconductor can be substantially zero. This device operates in contradistinction to proposed multiple control superconducting switching devices in which the fluxes from plural superconductors, even though resulting from oppositely directed currents, each create a magnetic field in the vicinity of the gate superconductor tending to render it resistive.

In accordance with an embodiment of the present invention, a bias current is applied to one or more of the control superconductors and preferably to the widened superconductor in order to alter the effect or operating point of currents in the remaining narrow overlaying control superconductor or superconductors.

Figure 2:
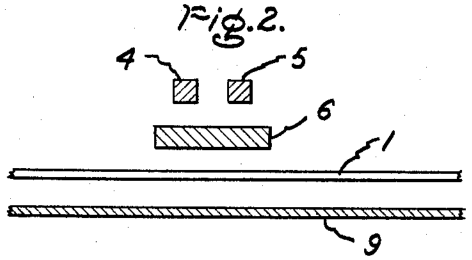
Figure 3:
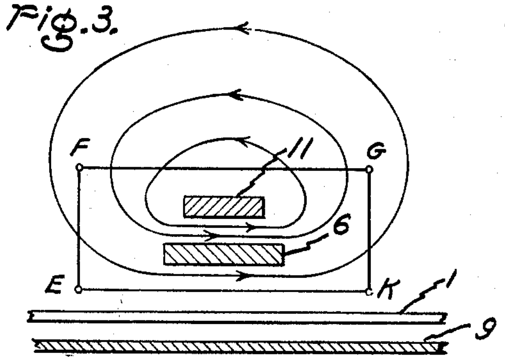
Figure 4:
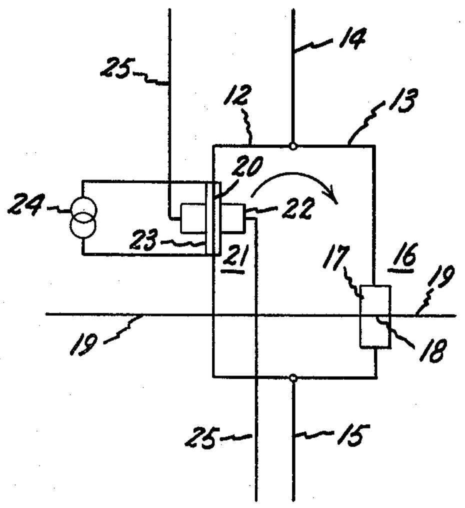

The subject matter which we regard as our invention is particularly pointed out and distinctly claimed in the concluding portion of this specification. The invention, however, both as to organization and method of operation, together with further objects and advantages thereof, may best be understood by reference to the following description taken in connection with the accompanying drawings wherein like reference characters refer to like elements and in which:

FIG. 1 is a perspective view partially in cross-section of a switching device in accordance with the present invention, FIG. 2 is a schematic cross-sectional view of the FIG. 1 switching device, FIG. 3 is a schematic cross-sectional view of an alternative switching device in accordance with the present invention, and FIG. 4 is a schematic diagram of a superconducting memory cell, including a superconducting switching device.

Referring to the drawings, the switching device includes a gate superconductor whose resistance is controlled by plural control superconductors including one control superconductor interposed between one or more remaining control superconductors and the gate superconductor. This intervening control superconductor is wider than the combination of remaining superconductors in the direction transverse to the flow of current therein so flux generated by current flow in the control superconductors will pass the widened control superconductor in order to reach the gate superconductor, and will thus be concentrated at a given area of the gate superconductor.

In the FIG. 1 embodiment the gate superconductor 1 formed of material exhibiting a first critical magnetic field is supported upon a base 2. A thin insulating layer 3 separates the gate superconductor from control superconductors 4, 5 and 6, disposed generally transversely across the gate superconductor for establishing a magnetic field in the vicinity of the gate superconductor greater than its critical magnetic field to selectively establish resistance in the gate superconductor for predetermined current flow in one or more of the control superconductors. Current flow in a first reference direction is indicated for control superconductors 4, 5 and 6 at A, B and C, respectively, in FIG. 1, and for gate 1 at D.

Control superconductor 6 in this embodiment provides support for the overlaying control superconductors 4 and 5 and is insulated therefrom by means of a thin insulating layer 7 therebetween. The same embodiment is illustrated in simplified cross-section in FIG. 2, omitting the intervening insulating layers. Control superconductor 6 is wider than control superconductors 4 and 5 and is interposed between control superconductors 4 and 5 and the gate superconductor 1. Control superconductor 6 may be said to be wider than the remaining control superconductors 4 and 5, collectively. That is, control superconductor 6 is wider in a direction transverse to the direction of current flow in the control superconductors than the vertical projection of the group of remaining control superconductors 4 and 5 upon the gate conductor 1. In this manner, control currents A and B flowing in control conductors 4 and 5 will establish a flux therearound which must pass the edge of wider control superconductor 6 before reaching the underlying gate superconductor 1. The magnetic flux from either control superconductor 4 or 5 which reaches gate superconductor 1 must pass the edge of control superconductor 6 at substantially the same point producing substantially the same effect at the areas of gate superconductor 1 lying immediately under the edge of control superconductor 6. Gate superconductor 1 sees the magnetic flux from all control superconductors as if it originated at the same superconductor.

In its physical construction, a specific device of the FIG. 1 embodiment conveniently employs a gate superconductor 1 of tin deposited in vacuum upon base 2 to a thickness of 0.3 micron, the base 2 including a glass sublayer 8, a superconducting, magnetically-reflective shield plane 9 and an insulating overlayer 10 of silicon monoxide. The shield plane 9 is effective in speeding the switching time of the device and in concentrating magnetic flux at gate superconductor 1. The insulating layers 3 and 7 are conveniently formed of silicon monoxide approximately 0.4 micron in thickness as deposited in vacuum in alternate layers between vacuum deposition of the gate and control conductors. The control conductors are suitably 1 micron in thickness with a width varying between 250 microns for control conductor 6, to 50 microns for control conductors 4 and 5. The widths of the control superconductors are much greater than either the separation between the superconducting gate and the control superconductors or the shield plane. Therefore, the field due to a current in a narrow control superconductor is concentrated in the area between films.

It is of course understood the two control conductors are shown primarily for illustration purposes and further controls may be disposed above control conductor 6 in the manner shown. These control conductors may be deposited in a further stacked relationship but are preferably placed side by side over control conductor 6 with control conductor 6 being appropriately widened to accommodate the number of control conductors desired. This construction of multiple control superconducting switching devices is simple in manufacture because only two layers of control film and their insulation need be deposited, the control conductor width being important only in the case of the wide lower control conductor 6.

It is understood the devices according to the present invention are operated at superconducting temperatures for the materials used. For tin gates and lead controls, a temperature of approximately 3.6° K. is suitable.

In illustrative operation the FIG. 1 device may be conveniently employed as a multiple input logic gate. In this instance the first current A in FIG. 1 may be applied to control conductor 4 and a second current B may be applied to control conductor 5 (by conventional means not shown). For this operation, a current —C is also applied to control conductor 6 (also by conventional means not shown). According to this arrange, an "and" logical function is provided with A and B as the "and" inputs. The current applied to underlying control conductor 6 is negative in direction to that of A or B and is also arranged to be substantially double that of either A or B, the currents A and B, when present being arranged to be equal. If A and B are both present, the flux generated jointly around control superconductors 4 and 5 will just cancel the flux established by the current —C in control conductor 6, thus leaving gate superconductor 1 in a resistanceless or superconducting condition. However, if only one or neither of the currents A and B are present, a net resultant flux will render gate superconductor 1 resistive. Thus gate superconductor 1 will be resistanceless, passing a supercurrent D, only when both currents A and B are present.

The current in control superconductor 6 is in effect a bias current for altering the effect of the currents in control superconductors 4 and 5. The currents in control superconductors 4 and 5 would normally render the gate superconductor 1 resistive but for the counteracting or biasing effect of underlying control superconductor 6. Alternatively, a current in either of control superconductors 4 or 5 may be employed as a bias current with respect to the other. Thus, with no current in control superconductor 6, the presence of a current A in control superconductor 4 may be nullified by the presence of an equal and opposite current —B which may be designated the bias current in control superconductor 5.

The FIG. 1 configuration is readily convertible to operation as an ordinary "or" gate. With no current flowing in superconductor 6, resistance in gate superconductor 1 indicates the presence of one or both of the quantities A or B. Also if a first input signal is designated as +A and another input signal is designated as —B, that is if signal currents flow in opposite directions in control superconductors 4 and 5, and no current is applied to control superconductor 6, the device may function as an exclusive "or" gate. An output for the device is indicated in this case if superconducting gate 1 is rendered resistive. It will be seen the gate superconductor 1 is rendered resistive if either A or —B is present but not if both or neither are present.

Many logical functions can be electrically programmed for the device of FIG. 1 without altering the physical construction thereof. Thus the single device can perform various logical functions at different instants of time in a computer, as dictated by the needs therefor. Many other logical functions in addition to those described can be performed and many more complex input arrangements may be accommodated by providing more than two control superconductors over the wider control superconductor 6.

Although the superconducting switching device employing two or more control superconductors over the widened superconductor is more flexible in its operation and is therefore preferred, similar operation is obtained employing a single control superconductor over and along a somewhat wider control superconductor. Such an arrangement is indicated in FIG. 3, illustrating a simplified schematic cross-section of the device, omitting the layers of insulation between conductors. This device may be used when only two control inputs are required. In this embodiment, a control superconductor 6 is disposed substantially transversely across a gate superconductor 1, control superconductor 6 being wider than another control superconductor 11 deposited on top of control superconductor 6 and properly insulated therefrom. The thicknesses of the various gate and control layers as well as the intervening insulation is substantially the same as described with reference to the FIG. 1 embodiment.

It is noted that in this structure as in the previous structure, the widths of the control superconductors are much greater than either the separation between control superconductors or the separation between the superconducting gate and the control superconductors or the shield plane 9. Therefore, the field due to a current A in the narrow control superconductor 11 is concentrated in the areas between films and is negligible everywhere else. In the FIG. 3 representation, the integral of $H \cdot ds$ along the paths EF, FG, and GK, where H equals the magneto motive force due to the control currents, will approach zero and the integral of $H \cdot ds$ along EK will be simply HW, where W is taken as the width of the wide control superconductor 6. This result is derived as follows by Ampere's law:

$$\oint H \cdot ds = 4\pi A \tag{1}$$

therefore $$HW = 4\pi A \tag{2}$$

therefore $$H = \frac{4\pi A}{W} \tag{3}$$

Therefore it will be seen that a current in the narrow control causes substantially the same field as the same current in the wide control beneath it. The most elementary flux paths are shown in the figure for current flow in control conductor 11.

In the FIG. 1 construction as hereinbefore set forth, the line integral $H \cdot ds$ will still be HW. The field H at the gate film, due to all control currents will be $$\frac{4\pi \Sigma I_c}{W}$$

where $\Sigma I_c$ is the sum of all control currents.

FIG. 4 illustrates a superconducting storage cell including a multiple control superconducting switching device. This storage cell is formed of a superconducting loop comprising sides 12 and 13, which loop acts to store a binary digit as a circulating current therein. For example, binary one is stored as a clockwise circulating current while a binary zero may be stored as a counterclockwise circulating current to provide the largest device tolerances. Under such circumstances it becomes desirable to detect not only the presence of a superconducting persistent loop current in the loop but also its direction. In this connection, the present superconducting switch device is *sensitive to the direction of its control current* and thus functions to provide effective readout in the memory cell.

Sides 12 and 13 forming the memory loop are joined at digit line conductors 14 and 15 so as to be in parallel therewith. A single control superconducting switching device 16 including a gate 17 and a control conductor 18 has its gate superconductor serially included in side 13 of the loop, its control superconductor 18 forming an extension of write line 19. The opposite side, 12, of the loop includes a control superconductor 20 of superconducting switching device 21. This superconducting switching device 21 also includes a gate superconductor 22 inserted in sense line 25 and a widened superconducting bias control superconductor 23 disposed along control superconductor 20 between control superconductor 20 and gate superconductor 22 and insulated from both. The control superconductor 23 is wide with respect to control superconductor 20 so that all the flux due to a current in control superconductor 20 must pass around control superconductor 23 if it is to reach gate superconductor 22 thereunder. Control superconductor 23 has applied thereacross a source of bias current 24 while gate superconductor 22 is serially included in a sense line 25.

The memory cell as herein described ordinarily comprises one of many such memory cells in a complete superconducting memory wherein the cells are interconnected by a matrix of superconductors including write line 19, sense line 25 and digit line conductors 14 and 15.

In operation, a digit binary one is inserted in the superconducting memory cell of FIG. 4 by first applying a current to the cell between digit line conductors 14 and 15. Since all conductors are superconducting, this current will at first divide between sides 12 and 13. Assuming the current flows in an upward direction from digit line conductor 15 to digit line conductor 14, an upward current will flow in each path of the loop. Providing the loop sides are substantially equal in inductance, substantially equal current will flow in each path.

Now a current is applied on write line 19 including control superconductor 18 of superconducting switching device 16 which renders resistive gate superconductor 17. The current in side 13 of the loop will now cease to flow because an alternative resistanceless path is available, i.e. side 12. The current in write line 19 is now discontinued but the current from the digit line conductor will continue to flow entirely in side 12 since no reactive forces are present at this time which would cause resumption of current in side 13. Inasmuch as side 12 contains no resistance, no steady state voltage exists across the loop which would initiate resumption of current flow in side 13.

Now the digit line current flowing in the digit line conductors 14 and 15 is discontinued. A reactive voltage is thereby established across side 12 because of the collapse of magnetic flux around side conductor 12; this voltage is in a direction to decrease the current flow in an upwards direction in side 12. The same voltage establishes current flow in a downwards direction in side 13. It has been found these two side currents will add to cause a continuously flowing persistent loop current in a clockwise direction in the superconducting memory cell. The loop current will continue indefinitely until such time as it may be "erased" by another current flowing in write line 19 and through control conductor 18 of superconducting switching device 16.

In order to sense the loop current in the memory cell, a sense current is applied to sense line 25 serially including gate 22. In accordance with circuit devices as heretofore employed, superconducting gate 22, under side 12 of the superconducting memory cell becomes resistive due to loop current passing thereover in the control grid. The resistance is caused by the magnetic field generated around grid control superconductor 20. A voltage appears across gate superconductor 22 because of the resistance thereof, and this voltage can be detected in the sense line 25 indicating the presence of a circulating persistent current in the loop. However, while this system indicates the presence of a circulating current in the loop it does not indicate its direction. It is readily appreciated a memory cell would be more flexible and easier to fabricate and operate because of less stringent tolerances if it is capable of storing, and producing an indication of current stored, in either (clockwise and counterclockwise) direction.

As shown in the figure, the superconducting switching device 21 accomplishes a determination of the direction of current flow in the superconducting memory cell as well as detecting its presence. Current is applied to the widened control superconductor 23 in the same direction as the clockwise loop current flowing in control superconductor 20. The combination of these currents generates sufficient flux to render the gate superconductor 22 resistive. A voltage will then be sensed across gate superconductor 22 indicating the storage of a binary one (clockwise current) in the storage cell. But, as readily appears, a counterclockwise flow of current in the storage cell, indicating a binary zero, will tend to counteract the effect of bias current in control superconductor 22, and the gate superconductor 22 will not become resistive.

From the foregoing it is evident that the construction in accordance with the present invention affords close coupling between control superconductors giving nearly exact cancellation between equal and opposite currents in separate controls. The construction of multiple control superconducting switching devices is simplified because only two layers of control films and their insulation need be deposited and the width of the narrow controls as well as the definition thereof is less important.

Almost any number of plural control input signals may be applied to a number of separate controls, each of which produce substantially the same effect upon the gate superconductor for the same control current. Therefore the resultant field applied to the gate superconductor is dependent only on the algebraic sum of the control currents and not upon the placement of the control superconductors. The device provides directional effects and convenient biasing for shifting the effect of control currents for almost any number of possible logical functions.

Moreover a superconducting switching device is provided which is sensitive to the direction of control current flow. A superconducting memory cell including the superconducting switching device readily delivers an output indicative of the direction of current flow in the memory cell and therefore advantageously indicative of a digit stored therein on the basis of current flow direction.

While we have shown and described several embodiments of our invention, it will be apparent to those skilled in the art that many changes and modifications may be made without departing from our invention in its broader aspects; and we therefore intend the appended claims to cover all such changes and modifications as fall within the true spirit and scope of our invention.

What we claim as new and desire to secure by Letters Patent of the United States is:

1. A superconducting gate switching device comprising a gate superconductor for carrying current, having connections at either end thereof, and plural control superconductors, said plural control superconductors including at least a first current carrying control superconductor establishing a magnetic field at said gate superconductor, and a second control superconductor wider than said first control superconductor interposed between said first superconductor and said gate superconductor and adjoining said gate superconductor, the magnetic field flux established by current flow in said first superconductor passing around the greater width of said second control superconductor in establishing said magnetic field at said gate superconductor.

2. A superconducting switching device comprising a gate superconductor for carrying a current, plural control superconductors, and superconducting means for concentrating the magnetic flux established by at least one of said control superconductors upon a given area of said gate superconductors, wherein said superconducting means is wider than said one of said control superconductors to shield said gate from said one of said control superconductors such that magnetic flux from said one of said control superconductors must pass around both sides of said superconducting means to reach said gate.

3. A superconducting switching device comprising a gate superconductor for carrying a current and plural first control superconductors spaced close to said gate superconductor, and means comprising a second control superconductor interposed directly between said first control superconductor and said gate superconductor and being wider than said first control superconductor for concentrating the magnetic flux of said first control superconductors at a given area of said gate superconductor.

4. A superconducting switching device comprising a superconducting base, a gate superconductor film for carrying a current supported upon said base and insulated therefrom, a first control superconductor disposed transversely of said gate superconductor, close spaced thereto and insulated therefrom, said first control superconductor having a first width, and plural second control superconductors having a width less than said first width disposed along said first control superconductor, close spaced thereto and insulated therefrom, with said first control superconductor interposed between said second control superconductor and said gate superconductor, said control superconductors having a higher critical field than said gate superconductor.

5. A superconducting switching device comprising a gate superconductor for carrying a current and plural current carrying control superconductors each establishing a magnetic field at said gate superconductor for rendering resistive said gate superconductor, said plural control superconductors including at least a first control superconductor for rendering resistive said gate superconductor and a second control superconductor interposed between said first control superconductor and said gate superconductor and adjoining said gate superconductor, said second control superconductor having a wider lateral dimension substantially transverse to the direction of current flow in said first control superconductor so that magnetic flux established by current in said first control superconductor passes around a wider lateral dimension of said second control superconductor in establishing a magnetic field at said gate superconductor.

6. A superconducting switching device comprising a gate superconductor for carrying a current and plural control superconductors, said plural control superconductors including a plurality of first control superconductors for rendering resistive said gate superconductor and a second control superconductor interposed between said first plurality of control superconductors and said gate superconductor, said second control superconductor having a wider lateral dimension than the combined lateral dimension of said first plurality of control superconductors as projected perpendicularly upon said gate superconductor, so that magnetic flux established by current in said first plurality of control superconductors passes around the wider lateral dimension of said second control superconductor to be concentrated upon a given area of said gate superconductor.

7. A superconducting memory cell comprising a first superconducting switching device and a second superconducting switching device, each including a gate superconductor and at least one control superconductor constructed of material having a higher critical field than said gate superconductor, a superconducting persistent current loop including a control of a first superconducting switching device and the gate superconductor of a second superconducting switching device, an additional widened control superconductor for said first superconducting switching device interposed between said control of said first superconducting switching device and the corresponding gate superconductor, and means providing a bias current for a control superconductor of said first superconducting switching device.

8. A superconducting switching device comprising a gate superconductor for carrying a current exhibiting a first critical magnetic field at which resistance returns, a plurality of control superconductors exhibiting higher critical fields and including a wider control superconductor interposed between said gate superconductor and the remaining control superconductors so that the flux from said control superconductor is concentrated upon a given area of said gate superconductor, and means providing a bias current for said wider control superconductor.

References Cited by the Examiner

UNITED STATES PATENTS

| | | | |
|---|---|---|---|
| 2,989,714 | 6/61 | Park et al. | 307—88.5 X |
| 3,116,422 | 12/63 | May et al. | 307—88.5 |

OTHER REFERENCES

Brennemann: IBM Technical Disclosure Bulletin, vol. 5, No. 1, June 1962, page 24.

JOHN W. HUCKERT, *Primary Examiner.*

ARTHUR GAUSS, *Examiner.*